US008476128B2

(12) United States Patent
Arayashiki

(10) Patent No.: US 8,476,128 B2
(45) Date of Patent: Jul. 2, 2013

(54) SEMICONDUCTOR DEVICE HAVING INSULATED GATE FIELD EFFECT TRANSISTORS AND METHOD OF FABRICATING THE SAME

(75) Inventor: Yusuke Arayashiki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 12/652,062

(22) Filed: Jan. 5, 2010

(65) Prior Publication Data

US 2010/0176455 A1 Jul. 15, 2010

(30) Foreign Application Priority Data

Jan. 9, 2009 (JP) ................................ P2009-003840

(51) Int. Cl.
*H01L 21/8238* (2006.01)

(52) U.S. Cl.
USPC .......................................... 438/199; 257/407

(58) Field of Classification Search
USPC ............ 257/369, 371, 407, E29.159, E19.16, 257/E21.202; 438/197, 199
See application file for complete search history.

(56) References Cited

U.S. PATENT DOCUMENTS

| 7,122,414 | B2 * | 10/2006 | Huotari .......................... 438/199 |
| 7,432,567 | B2 * | 10/2008 | Doris et al. .................... 257/407 |
| 7,612,422 | B2 * | 11/2009 | Chambers et al. ............. 257/407 |
| 2006/0267116 | A1 * | 11/2006 | Shimamoto et al. .......... 257/411 |

FOREIGN PATENT DOCUMENTS

| JP | 2006-93670 | 4/2006 |
| JP | 2006-332179 | 12/2006 |

* cited by examiner

*Primary Examiner* — Matthew Landau
*Assistant Examiner* — Candice Y Chan
(74) *Attorney, Agent, or Firm* — Finnegan, Henderson, Farabow, Garrett & Dunner, L.L.P.

(57) ABSTRACT

A CMOSFET is composed of a P-channel MOSFET and an N-channel MOSFET formed on a silicon substrate. The P-channel MOSFET is formed a first gate insulating film, a first hafnium layer and a first gate electrode which are stacked on the silicon substrate. The N-channel MOSFET is formed a second gate insulating film, a second hafnium layer and a second gate electrode which are stacked on the silicon substrate. A surface density of the second hafnium layer is lower than a surface density of the first hafnium layer.

7 Claims, 15 Drawing Sheets

SEMICONDUCTOR DEVICE HAVING INSULATED GATE FIELD EFFECT TRANSISTORS AND METHOD OF FABRICATING THE SAME

CROSS REFERENCE TO RELATED APPLICATION

This application is based upon and claims the benefit of priority from the prior Japanese Patent Application No. P2009-3840, filed on Jan. 9, 2009, the entire contents of which are incorporated herein by reference.

FIELD OF THE INVENTION

The invention relates to a semiconductor device having insulated gate field effect transistors and a method of fabricating the same.

DESCRIPTION OF THE BACKGROUND

In manufacturing a MOSFET (Metal Oxide Semiconductor Field Effect Transistor) or a MISFET (Metal Insulator Semiconductor Field Effect Transistor), a method to lower an impurity concentration of a channel region is used so as to improve ON current. When the impurity concentration of the channel region is lowered, threshold voltages of the MOSFET or the MISFET decrease. For the reason, when the impurity concentration of the channel region is decreased so as to improve the ON current, a problem may arise that a threshold voltage decreases and a predetermined threshold voltage can not be obtained.

As means to solve the problem, a technique is known that a threshold voltage is increased by forming a hafnium layer, for example, between a gate insulating film and a gate electrode. A method to increase a threshold voltage using a hafnium layer is disclosed in Japanese Patent Application Publication 2006-332179. According to the method, decrease of a threshold voltage, which is caused lowering an impurity concentration of a channel region, can be compensated by increasing a surface density of a hafnium layer. As a result, it becomes possible to increase ON current of a MOSFET or a MISFET while keeping a predetermined threshold voltage.

However, it has not been known that an optimum surface density of a hafnium layer corresponding to improvement in performance of a CMOSFET (Complementary Metal Oxide Semiconductor Field Effect Transistor) or a CMISFET (Complementary Metal Insulator Semiconductor Field Effect Transistor).

SUMMARY OF THE INVENTION

According to an aspect of the invention is provided a semiconductor device, comprising a semiconductor substrate, a P-channel insulated gate field effect transistor including a first gate insulating film, a first hafnium layer and a first gate electrode which are stacked on the semiconductor substrate, and an N-channel insulated gate field effect transistor including a second gate insulating film, a second hafnium layer and a second gate electrode which are stacked on the semiconductor substrate, wherein a surface density of the second hafnium layer is lower than a surface density of the first hafnium layer.

According to another aspect of the invention is provided a method of fabricating a semiconductor device, comprising forming an N well layer and a P well layer in a surface region of a semiconductor substrate, forming a first gate insulating film on the N well layer and the P well layer, forming a first hafnium layer on the first gate insulating layer, etching the first gate insulating film and the first hafnium layer formed on the P well layer selectively, forming a second gate insulating film on the exposed P well layer, depositing a hafnium layer on the second gate insulating film and the first hafnium layer to form a second hafnium layer on the second gate insulating film so that a surface density of the first hafnium layer is higher than a surface density of the second hafnium layer, depositing a gate electrode material on the first and the second hafnium layers, and etching the gate electrode material, the first hafnium layer and the first gate insulating film which are formed on the N well layer so as to pattern the first gate insulating film, the first hafnium layer and a first gate electrode which are stacked on the N well layer, and etching the gate electrode material, the second hafnium layer and the second gate insulating film which are stacked on the P well layer so as to pattern the second gate insulating film, the second hafnium layer and a second gate electrode which are stacked on the P well layer.

SUMMARY OF THE INVENTION

DETAILED DESCRIPTION OF THE INVENTION

Embodiments of the invention will be described in detail with reference to the drawings.

Figure 1:
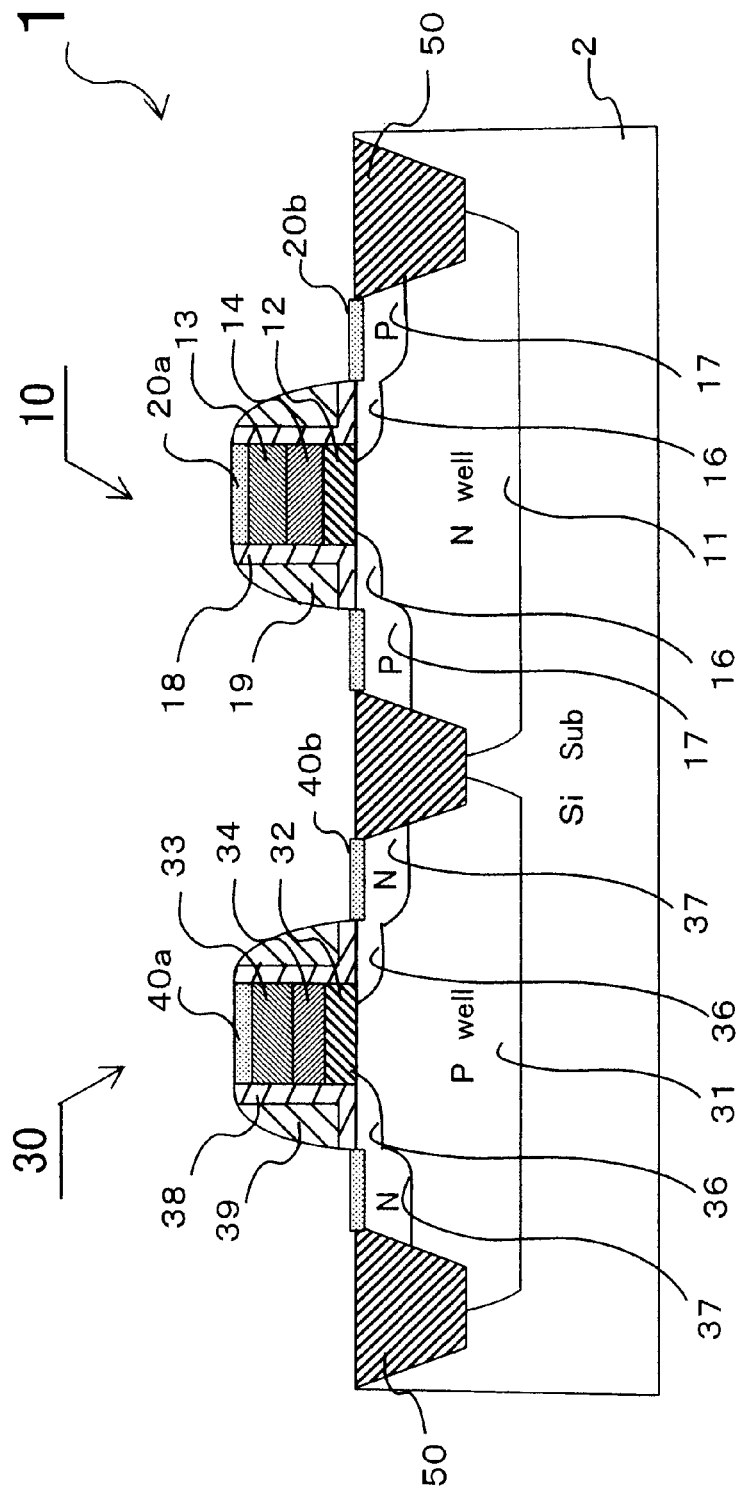
FIG. 1 is a cross-sectional view showing a semiconductor device according to a first embodiment of the invention.

A semiconductor device and a method of fabricating a semiconductor device according to a first embodiment of the invention will be described with reference to the drawings. FIG. 1 is a cross-sectional view showing a semiconductor device. In the embodiment, a surface density of a hafnium layer used in a gate of a N-channel MOSFET is set lower than a surface density of a hafnium layer used in a gate of a P-channel MOSFET.

As shown in FIG. 1, in a semiconductor device including a CMOSFET (Complementary Metal Oxide Semiconductor Field Effect Transistor) 1, an N well layer 11 and a P well layer 31 are provided in a surface of a silicon substrate 2. The CMOSFET 1 is composed of a P-channel MOSFET (Metal Oxide Semiconductor Field Effect Transistor) 10 formed on the N well layer 11 and an N-channel MOSFET 30 formed on the P well layer 31. The P-channel MOSFET 10 and the N-channel MOSFET 30 are isolated each other by a STI (Shallow Trench Isolation) 50 buried in the surface of the silicon substrate 2.

In a MOSFET, a gate insulating film is composed of a silicon oxide film ($SiO_2$ film). In a MISFET (Metal Insulator Semiconductor Field Effect Transistor), a gate insulating film is composed of an insulating film except a silicon oxide film, for example. A MOSFET and a MISFET are also referred as an insulated gate field effect transistor.

In the P-channel MOSFET 10, a gate insulating film 12, a hafnium layer 14, a gate electrode 13 and a silicide layer 20a are stacked on the N well layer 11. On the surface of the N well layer 11 at both sides of the gate insulating film 12, P type extension layers 16 are provided so as to overlap with the gate insulating film 12. At the regions contacting the P type extension layers 16 and facing the gate insulating film 12, P type source and drain layers 17 are provided. The P type source and drain layers 17 are formed at the both sides of the gate insulating film 12 through the P type extension layers 16, respectively. On the P type source and drain layers 17, silicide layers 20b are formed. An insulating film 18 and a side wall film 19 are provided at both sides of the gate insulating film 12, the hafnium layer 14, the gate electrode 13 and the silicide layer 20a which are stacked. The P type source and drain layers 17 are higher in impurity concentration than the P type extension layers 16. The gate electrode 13 is a polycrystalline silicon film doped with an impurity in a high concentration.

Here, the hafnium layer 14 is described as a layer as a matter of convenience, but actually the hafnium layer 14 is in a state that hafnium atoms are scattered on the gate insulating film 12. For the reason, a whole surface of the gate insulating film 12 is not necessarily covered with the hafnium layer 14. A surface density of the hafnium layer 14 provided in the P-channel MOSFET 10 is set higher than a surface density of a hafnium layer 34 provided in the N-channel MOSFET 30. (Detail will be described later). A surface density of the hafnium layer 34 is set lower than $3 \times 10^{13}$ (atoms/cm$^2$), for example. A surface density of hafnium is calculated using an XPS (X-ray Photoelectron Spectroscopy), but may be instead calculated using an EELS (Electron Energy Loss Spectroscopy) or an ICP-AES (Inductively-coupled Plasma Atomic Emission Spectroscopy).

In the N-channel MOSFET 30, a gate insulating film 32, a hafnium layer 34, a gate electrode 33 and a silicide layer 40a are stacked on the P-well layer 31. In a surface region of the P well layer 31 at both sides of the gate insulating film 32, N type extension layers 36 are provided so as to overlap with the gate insulating film 32. At the regions contacting the N type extension layers 36 and facing the gate insulating film 32, N type source and drain layers 37 are provided. The N type source and drain layers 37 are formed at both sides of the gate insulating film 32 through the N type extension layers 36, respectively. On the N type source and drain layers 37, silicide layers 40b are formed. An insulating film 38 and a side wall film 39 are provided at both sides of the gate insulating film 32, the hafnium layer 34, the gate electrode 33 and the silicide layer 40a which are stacked. The N type source and drain layer 37 is higher in impurity concentration than the N type extension layer 36. The gate insulating film 12 and the gate insulating film 32 are composed of a silicon oxide film (SiO$_2$ film). The gate electrode 33 is a polycrystalline silicon film doped with an impurity in a high concentration.

Figure 2:
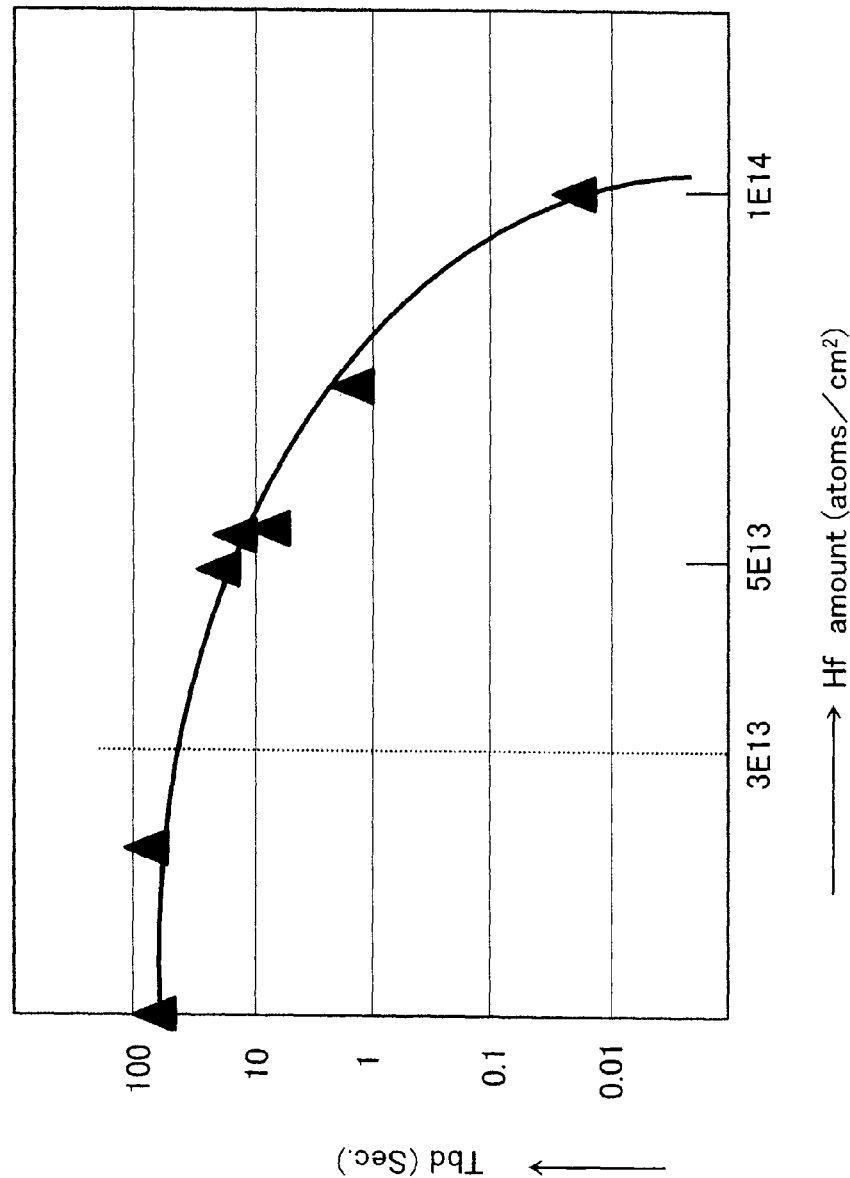
FIG. 2 is a TDDB characteristic diagram of an N-channel MOSFET according to the first embodiment of the invention.
Figure 3:
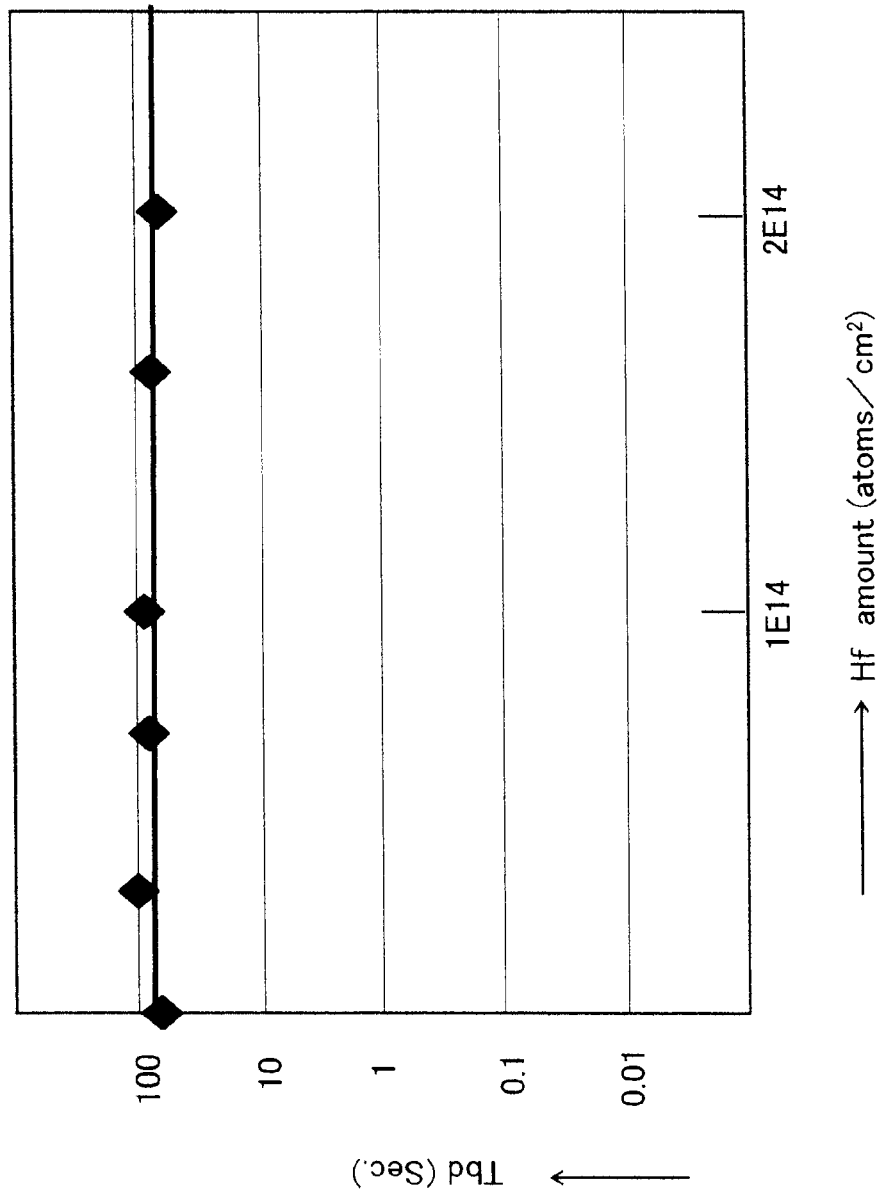
FIG. 3 is a TDDB characteristic diagram of a P-channel MOSFET according to the first embodiment of the invention.
Figure 4:
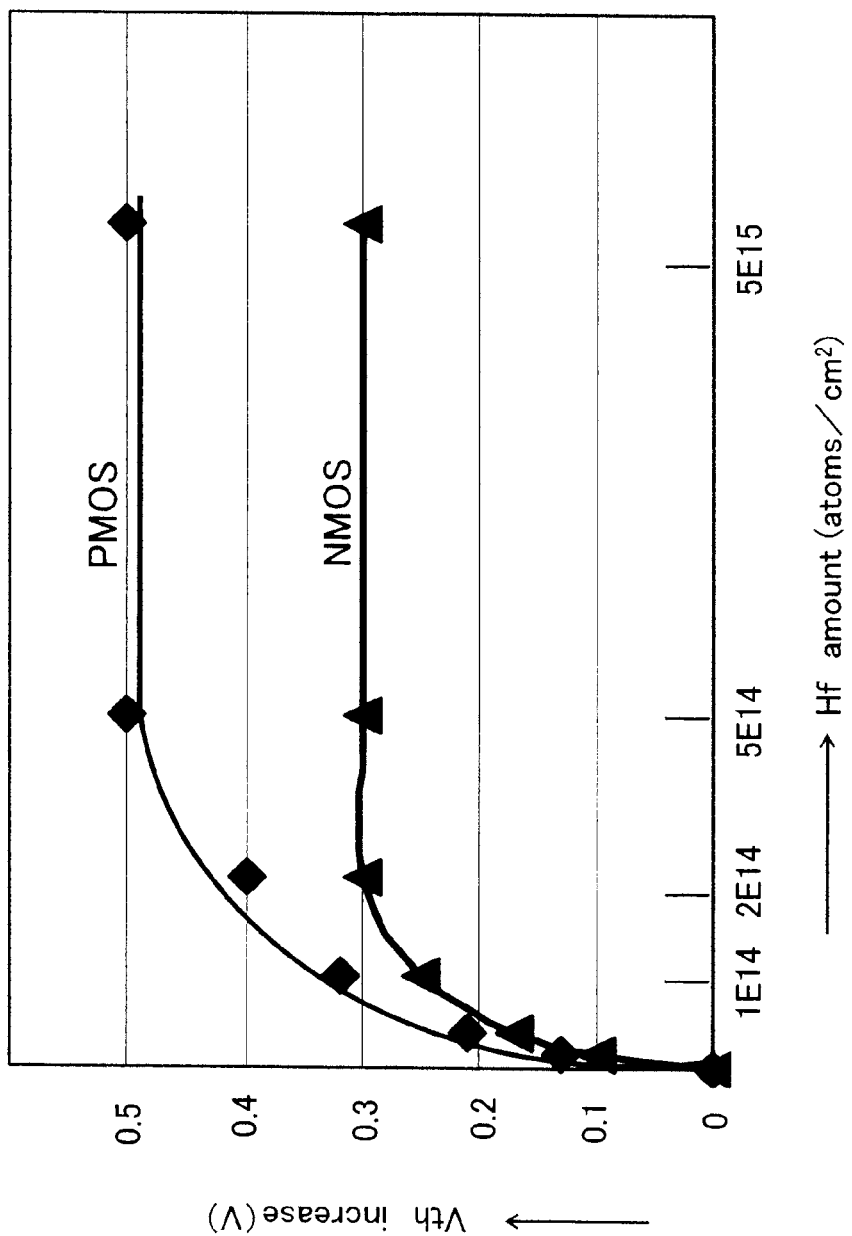
FIG. 4 is a diagram showing change of a threshold voltage for a hafnium concentration according to the first embodiment of the invention.

Next, the characteristic of a MOSFET will be described with reference to FIG. 2 to FIG. 4 in case that a hafnium layer is provided between a gate insulating film and a gate electrode. FIG. 2 is a TDDB (Time Dependent Dielectric Breakdown) characteristic diagram of the N-channel MOSFET. FIG. 3 is a TDDB characteristic diagram of the P-channel MOSFET. FIG. 4 is a diagram showing a change of a threshold voltage for a concentration of hafnium.

As shown in FIG. 2, in the N-channel MOSFET, at a region in which a surface density of hafnium is between zero and $3 \times 10^{13}$ (atoms/cm$^2$), the TDDB life time Tbd has approximately a constant value. The TDDB life time Tbd does not deteriorate in case that the surface density of hafnium is lower than $3 \times 10^{13}$ (atoms/cm$^2$) compared with a case that hafnium is not used. But in case that the surface density of hafnium becomes higher than $3 \times 10^{13}$ (atoms/cm$^2$), the TDDB life time Tbd rapidly deteriorates. TDDB is a phenomenon that the gate insulating film breaks down when it is continuously applied a voltage lower than a dielectric breakdown voltage. The life time Tbd estimated on the basis of the TDDB measurement is used as a important index to estimate a life of a semiconductor device composed of a MOSFET and a MISFET. Here, the TDDB life time Tbd@63% in FIG. 2 is defined as a time when a cumulative failure rate of a semiconductor device gets to 63%.

As shown in FIG. 3, in the P-channel MOSFET, even though the surface density of hafnium changes (a region between zero and $2 \times 10^{14}$ (atoms/cm$^2$)), the TDDB life time Tbd has approximately a constant value. The TDDB life time Tbd does not deteriorate in case that the surface density of hafnium is lower than $2 \times 10^{14}$ (atoms/cm$^2$) compared with a case that hafnium is not used.

When the TDDB life time Tbd that is an important index for the life of a semiconductor device is considered, a most appropriate region (lower than $3 \times 10^{13}$ (atoms/cm$^2$)) exists for the surface density of hafnium in the N-channel MOSFET. On the other hand, in the P-channel MOSFET, the TDDB life time Tbd does not depend on the surface density of hafnium.

As shown in FIG. 4, in the N-channel MOSFET, at a region where the surface density of hafnium is between zero and $2 \times 10^{14}$ (atoms/cm$^2$), the more the surface density of hafnium increases, the larger a value of a threshold voltage (Vth) becomes and the larger an increased amount of the threshold voltage (Vth) becomes. At a region where the surface density of hafnium is more on a side of the gate insulating film 32, the hafnium layer 34, the gate electrode 33 and the silicide layer 40a which are stacked, than $2 \times 10^{14}$ (atoms/cm$^2$), the value of the threshold voltage (Vth) does not depend on the surface density of hafnium and the increased amount of the threshold voltage (Vth) becomes a constant value.

On the other hand, in the P-channel MOSFET, at a region where the surface density of hafnium is between zero and $5 \times 10^{14}$ (atoms/cm$^2$), the more the surface density of hafnium increases, the larger an absolute value of the threshold voltage (Vth) becomes and the larger the increased amount of the threshold voltage (Vth) becomes. At a region where the surface density of hafnium is more than $5 \times 10^{14}$ (atoms/cm$^2$), a value of the threshold voltage (Vth) does not depend on the surface density of hafnium and the increased amount of the threshold voltage (Vth) becomes a constant value.

As described above, by inserting hafnium between the gate insulating film and the gate electrode, the threshold voltages of the N-channel MOSFET and the P-channel MOSFET can be controlled. As a result, without increasing a concentration of an impurity in the channel region to a high concentration, the desired threshold voltage can be obtained. For the reason, a concentration of an impurity in the channel region is made low, and the ON currents of the N-channel MOSFET 30 and the P-channel MOSFET 10 can be improved.

In the CMOSFET 1, hafnium is inserted between the gate insulating film and the gate electrode and the surface densities of hafnium in the N-channel MOSFET 30 and the P-channel MOSFET 10 are set to appropriate values, respectively. As a result, the characteristics of the CMOSFET 1 composed of the N-channel MOSFET 30 and the P-channel MOSFET 10 can be improved, and the life time of the semiconductor device can be improved.

Next, a method of fabricating the semiconductor device including the CMOSFET 1 will be described with reference to the drawings. FIG. 5 to FIG. 11 are cross-sectional views for illustrating a fabrication process for the semiconductor device.

Figure 5:
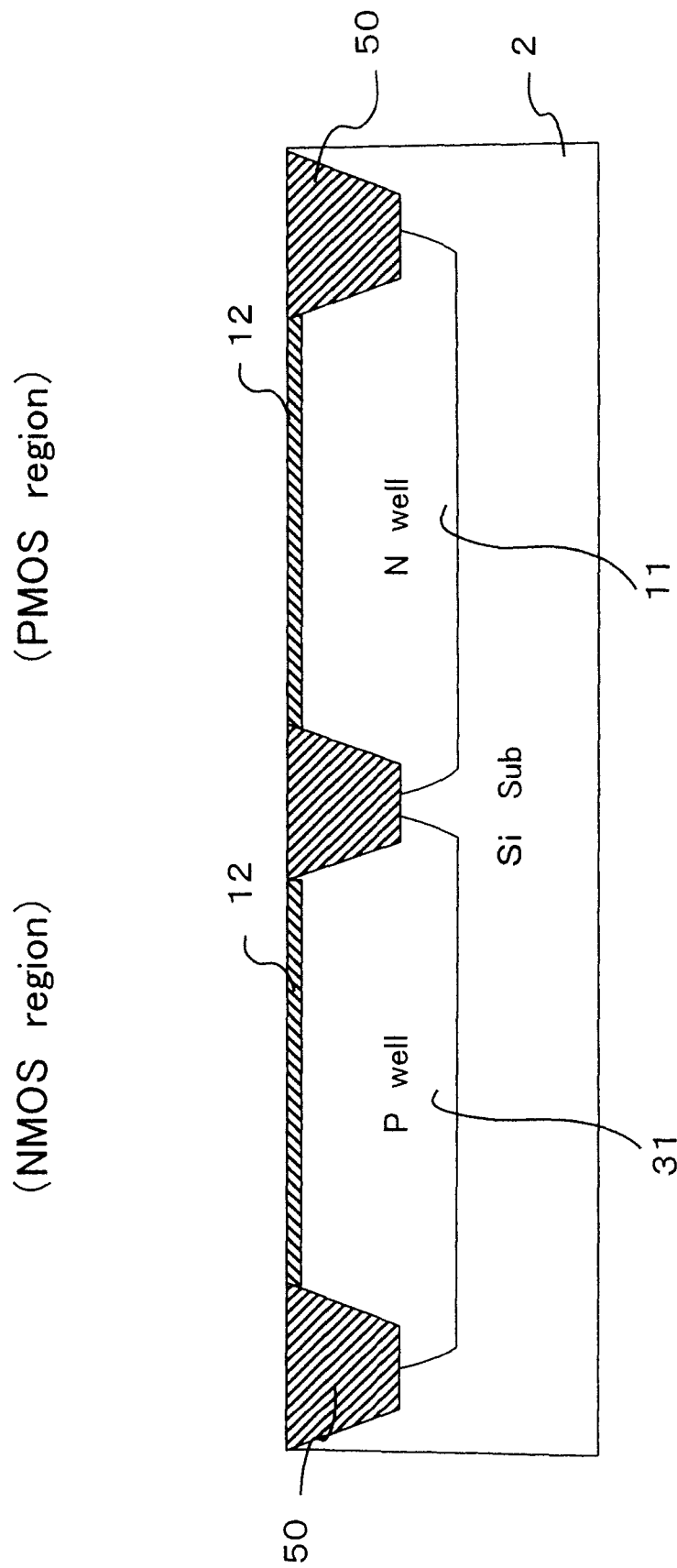
FIG. 5 to FIG. 11 are cross-sectional views for illustrating a fabrication process for the semiconductor device according to the first embodiment of the invention.

As shown in FIG. 5, firstly, the STI 50 is formed in a surface region of the silicon substrate 2 so as to isolate a region to form the P-channel MOSFET 10 (hereinafter, called simply as a PMOS region) from a region to form the N-channel MOSFET 30 (hereinafter, called simply as an NMOS region). The STI 50 is formed using a following method, for example. Firstly, a silicon nitride film (SiN film) which will become a mask later is deposited on the surface of the silicon substrate 2 through a buffer film. A resist film is formed on the silicon nitride film using a well-known lithography method. A mask is formed by etching the silicon nitride film and the buffer film using the resist film. Using the mask, a trench is formed by etching the surface of silicon substrate 2 to a predetermined depth. After removing the resist film, a silicon oxide film is deposited on whole the surface of the silicon substrate 2. Using a CMP (Chemical Mechanical Polishing) method, for example, the silicon oxide film is polished till the surface of the silicon substrate 2 is exposed to make the surface of the silicon substrate 2 flat. As a result, the silicon oxide film is buried in the trench. By removing the silicon nitride film which was used as the mask and the buffer film, the STI 50 is formed.

After forming the STI 50, using a well-known ion implantation method and a well-known heat treatment method, the N well layer 11 is formed in the surface region of the silicon substrate 2 at the PMOS region, and the P well layer 31 is formed in the surface region of the silicon substrate 2 at the NMOS region. After forming the N well layer 11 and the P well layer 31, the gate insulating films 12 composed of the silicon oxide film ($SiO_2$ film) are formed on the N well layer 11 and the P well layer 31 by oxidizing the surface of the silicon substrate 2 at the high temperature in the presence of oxygen, for example.

Figure 6:
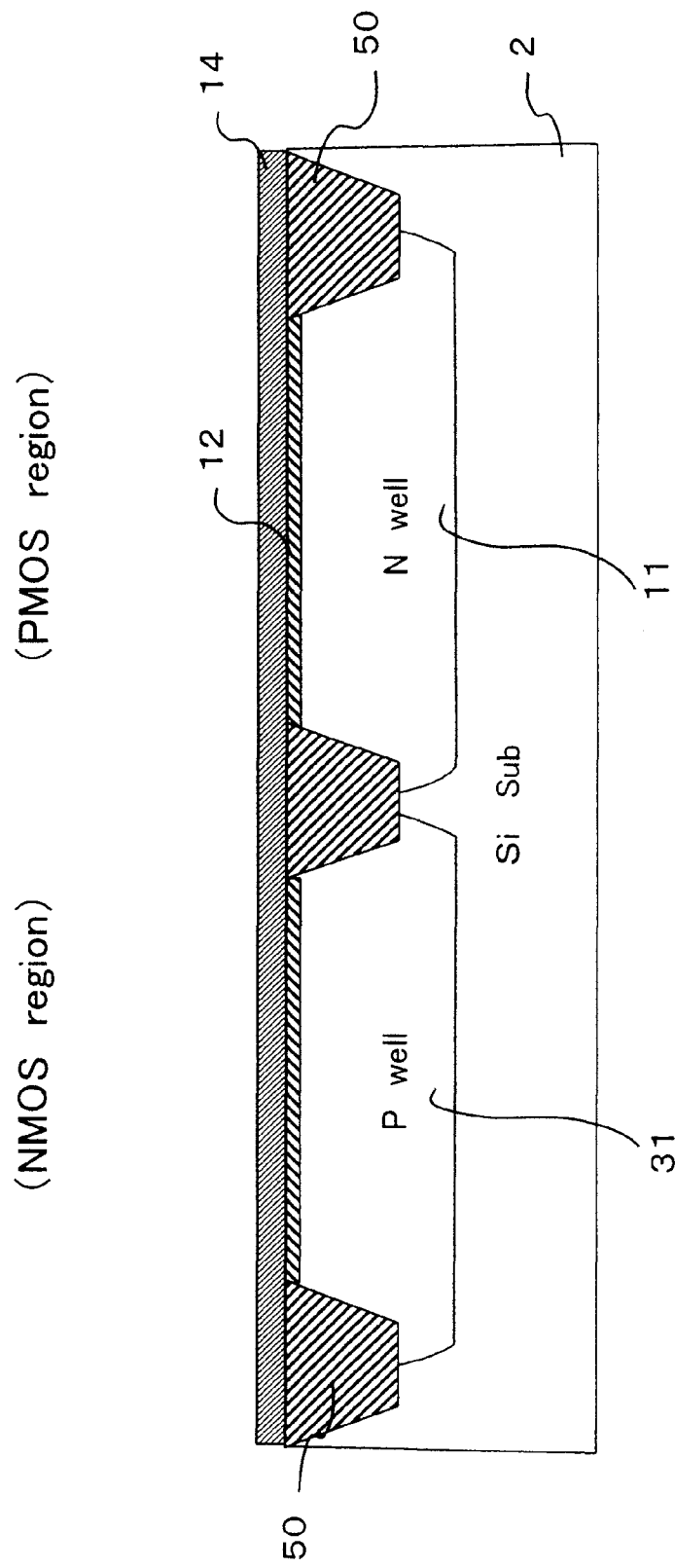

Next, as shown in FIG. 6, hafnium is deposited on the gate insulating films 12 using a sputter deposition method, for example, to form the hafnium layer 14. As the sputter deposition method used here, it is preferable to use a sputter apparatus of a lower power type than a metal sputter used in a backend and so on. The surface density of the hafnium layer 14 is adjusted by changing the deposition time, for example. Here, the hafnium layer 14 is formed using a sputter deposition method, but may be formed using an ALD (Atomic Layer Deposition) method or a MOCVD (Metal Organic Chemical Vapor Deposition) method instead.

Figure 7:
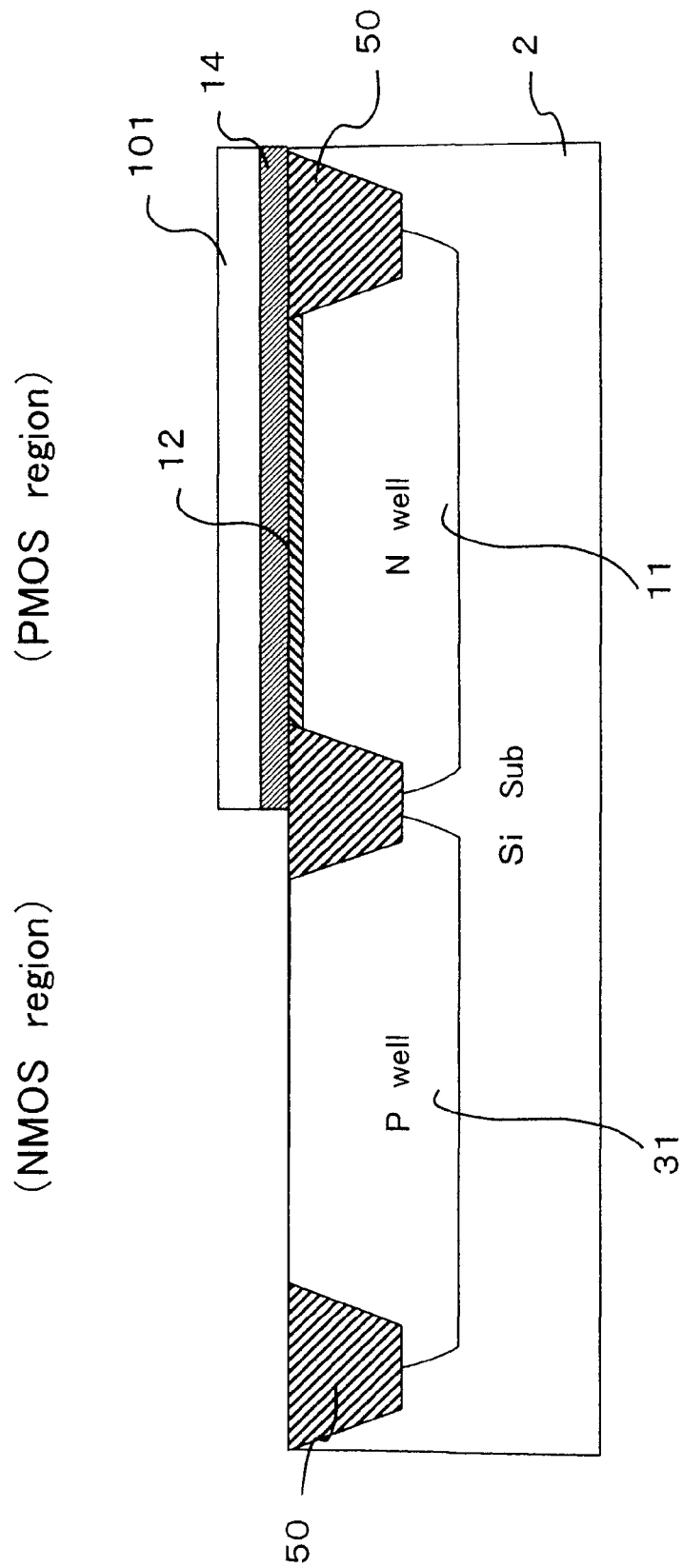

Subsequently, as shown in FIG. 7, a mask material 101 is formed on the hafnium layer 14. A resist film is formed on the mask material 101 at the PMOS region using a well-known lithography method. The mask material 101 is etched using the resist film as a mask. After removing the resist film, the hafnium layer 14 and the gate insulating film 12 at the NMOS region are etched using the mask material 101 as a mask and using dilute hydrofluoric acid, for example. The mask material 101 is then removed. As a result, the gate insulating film 12 and the hafnium layer 14 are stacked on the N well layer 11 at the PMOS region. The surface of the P well layer 31 at the NMOS region is exposed.

Figure 8:
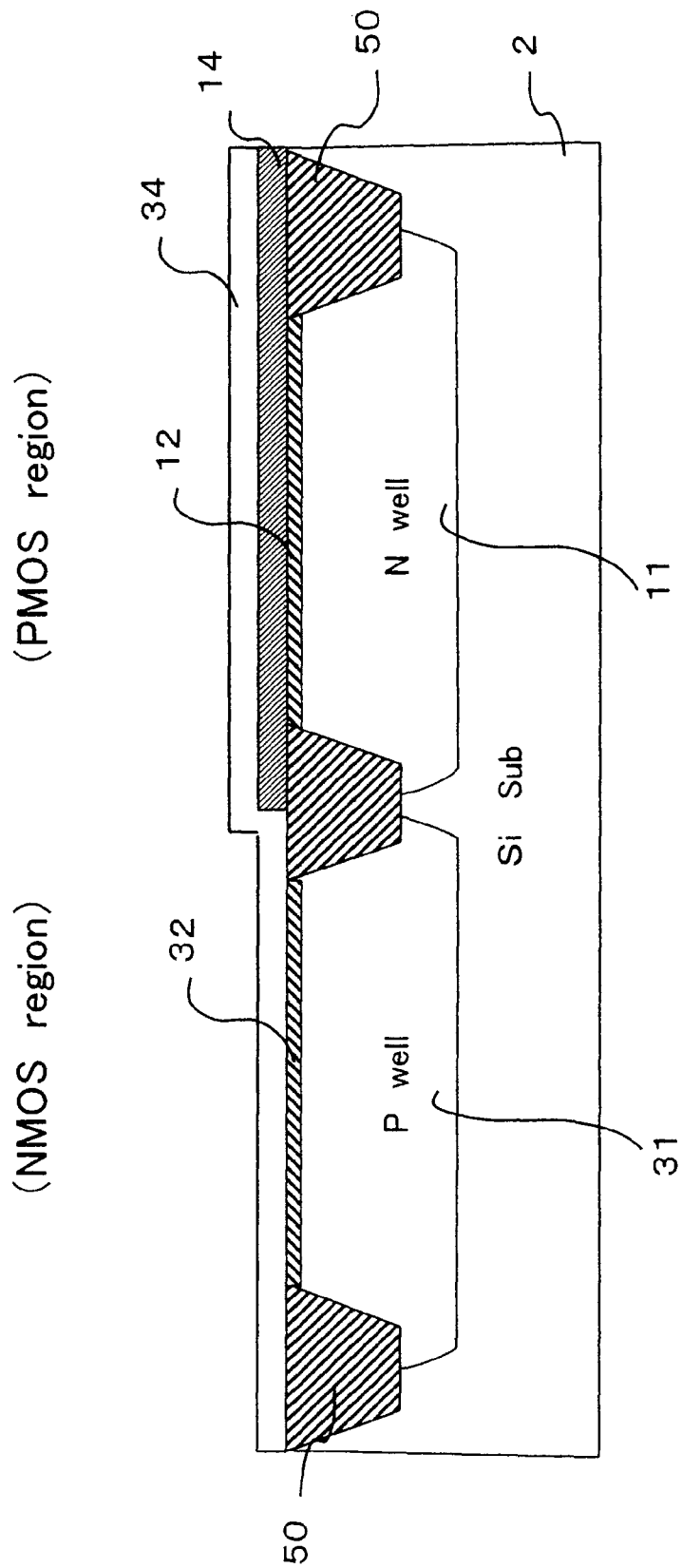

Then, as shown in FIG. 8, the surface of the silicon substrate 2 is oxidized by the high temperature heat treatment in the presence of oxygen, for example, to form the gate insulating film 32 composed of a silicon oxide film ($SiO_2$ film) on the P well layer 31. In this time, as the silicon substrate 2 at the PMOS region is also oxidized by the high temperature heat treatment, a film thickness of the gate insulating film 12 increases slightly.

After forming the gate insulating film 32, hafnium is deposited on the gate insulating film 32 and the hafnium layer 14 using a sputter deposition method, for example. The hafnium layer 34 is formed on the gate insulating film 32. At the PMOS region, as hafnium is deposited on the hafnium layer 14, the surface density of the hafnium layer 14 increases. As a result, the surface density of the hafnium layer 14 is set higher than the surface density of the hafnium layer 34. In this time, the surface density of the hafnium layer 34 is set higher than $3 \times 10^{13}$ (atoms/$cm^2$). As the sputter deposition method used here, it is preferable to use a sputter apparatus of a lower power type than a metal sputtering used in a backend and so on. The surface density of the hafnium layer 14 is adjusted by changing a time, for example. Here, the hafnium layer 14 is formed using a sputter deposition method, but may be formed using an ALD method or a MOCVD method instead.

Figure 9:
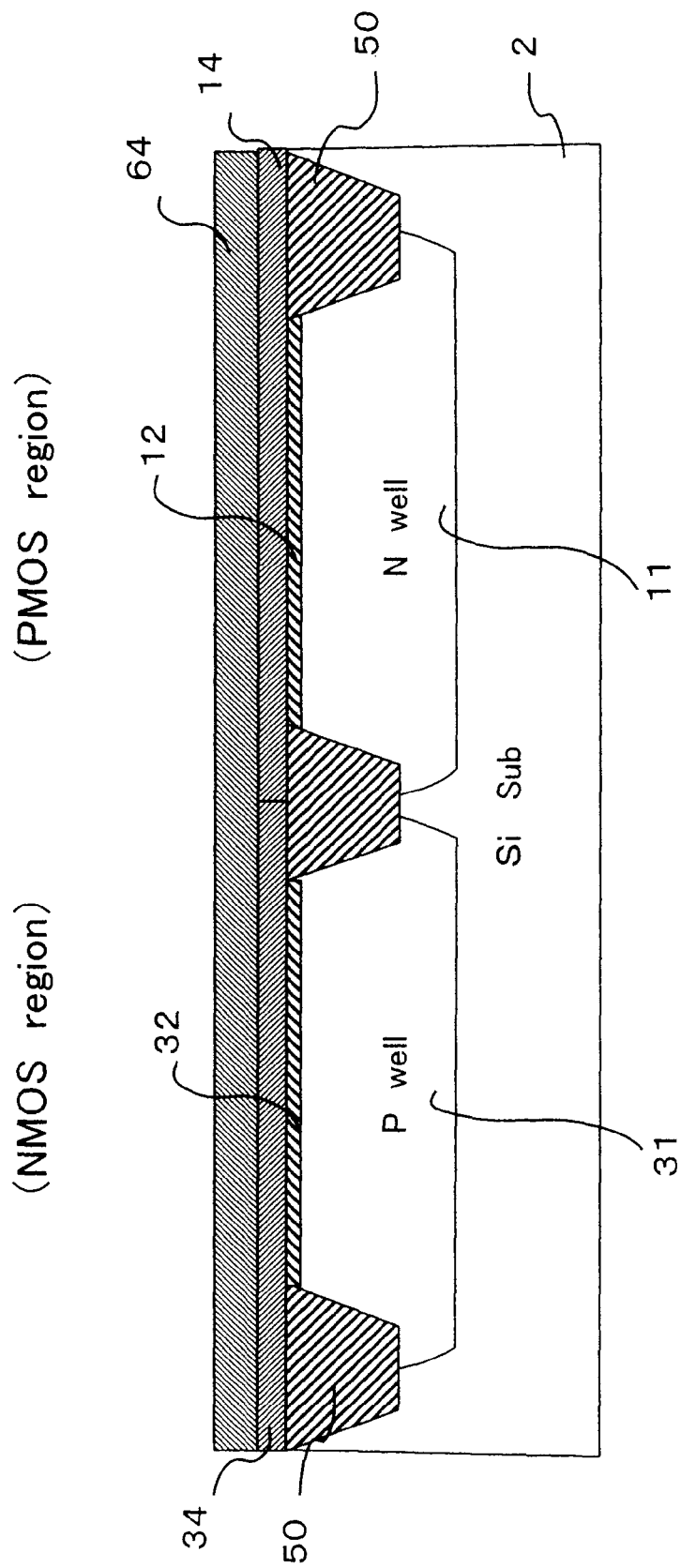

Next, as shown in FIG. 9, an electrode material 64 composed of a polycrystalline silicon film doped with an impurity in a high concentration is formed on the hafnium layer 14, the hafnium layer 34 and the STIs 50 using a CVD (Chemical Vapor Deposition) method, for example. Here, the polycrystalline silicon film is used, but instead an amorphous silicon film doped with an impurity in a high concentration may be used.

Figure 10:
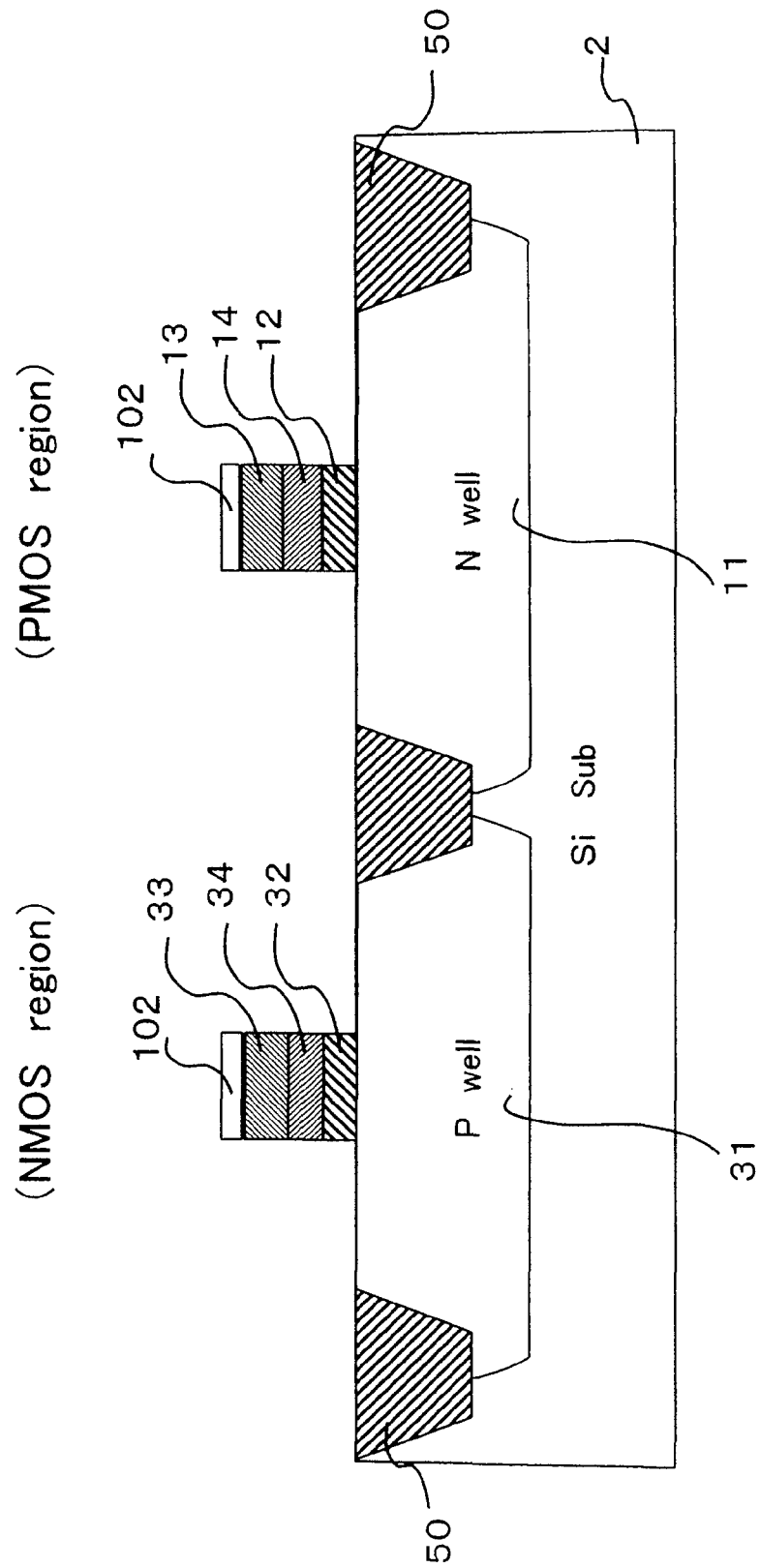

Subsequently, as shown in FIG. 10, a mask material 102 is formed on the electrode material 64. Resist films are formed on the mask material 102 at the PMOS region and the mask material 102 at the NMOS region using a well-known lithography method. The mask materials 102 are etched using the resist films as masks. After removing the resist films, the electrode material 64, the hafnium layer 14 and the gate insulating film 12 at the PMOS region and the electrode material 64, the hafnium layer 34 and the gate insulating film 32 at the NMOS region are continuously etched using the mask materials 102 as masks and using a RIE (Reactive Ion Etching) method, for example. After the RIE treatment, the mask materials 102 are removed. As a result, at the PMOS region the gate insulating film 12, the hafnium layer 14 and the gate electrode 13 are patterned and stacked. At the NMOS region, the gate insulating film 32, the hafnium layer 34 and the gate electrode 33 are patterned and stacked.

Figure 11:
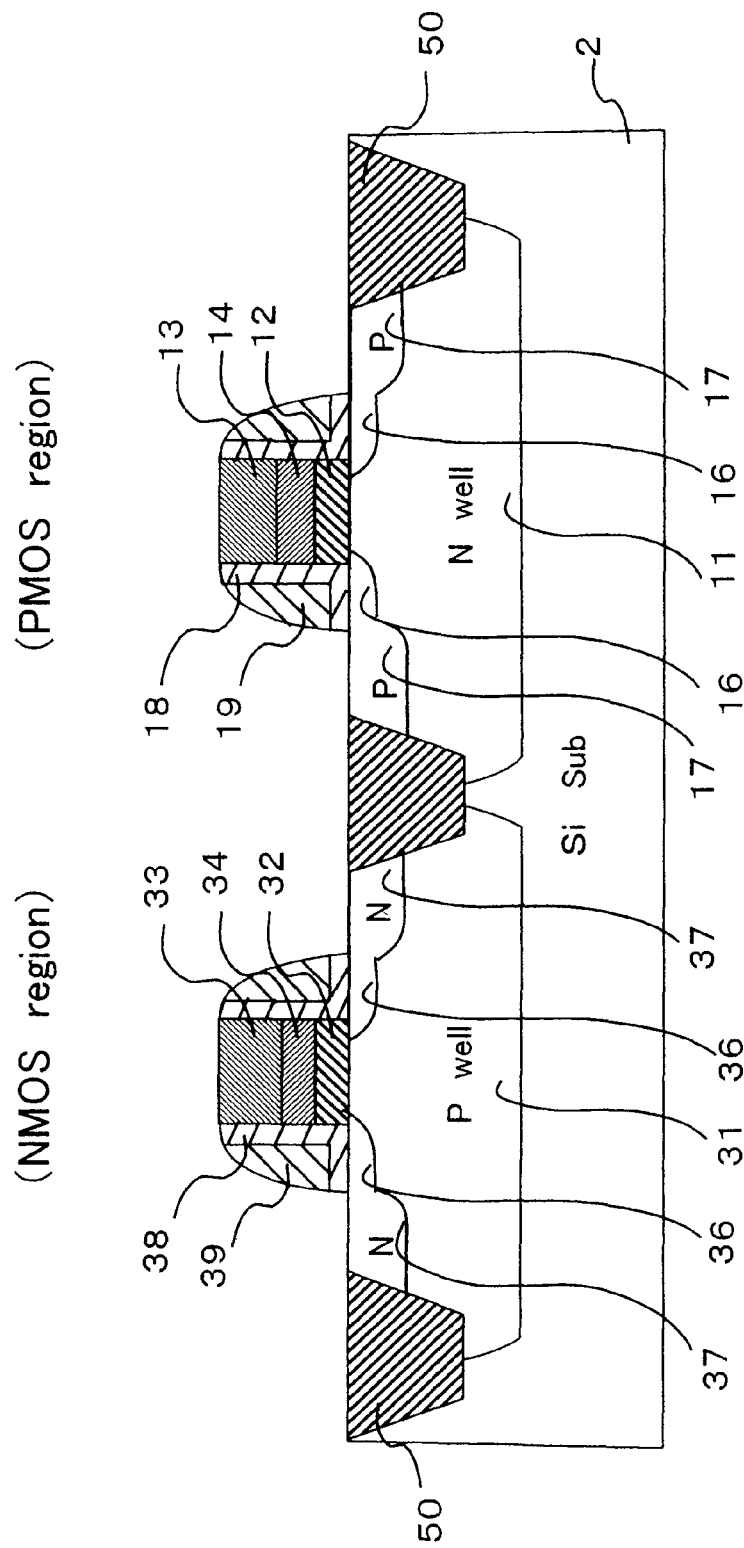

And as shown in FIG. 11, the PMOS region is covered with a resist film, for example, and the N type extension layers 36 are formed in the surface region of the P well layer 31 using the gate electrode 33 as a mask and by ion implanting an N type impurity in the P well layer 31. After removing the resist film, the NMOS region is covered with a resist film, for example, and the P type extension layers 16 are formed in the surface region of the N well layer 11 using the gate electrode 13 as a mask and by ion implanting an P type impurity in the N well layer 11. After removing the resist film, the N type extension layers 36 and the P type extension layers 16 are high temperature heat treated so as to activate.

On the whole surface of silicon substrate 2 including the gate electrode 13, the gate electrode 33, P type extension layers 16, the N type extension layers 36 and the STIs 50, a silicon nitride film and a silicon oxide film are sequentially deposited using a CVD method, for example. Using an RIE method, the silicon nitride film and the silicon oxide film are etched back. As a result, the insulating film 18 and the side wall film 19 are formed at a side surface of the gate insulating film 12, the hafnium layer 14 and the gate electrode 13 which are stacked. The insulating film 38 and the side wall film 39 are formed at a side surface of the gate insulating film 32, the hafnium layer 34 and the gate electrode 33 which are stacked.

After forming the insulating film 18, the insulating film 38, the side wall film 19 and the side wall film 38, the PMOS region is covered with a resist film, for example, and using the gate electrode 33, the insulating film 38 and the side wall film 39 as a mask and by ion implanting an N type impurity in the P well layer 31, the N type source and drain layers 37 are formed in the surface region of the P well layer 31. After removing the resist film, the NMOS region is covered with a resist film, for example, and using the gate electrode 13, the insulating film 18 and the side wall film 19 as a mask and by ion implanting an P type impurity in the N well layer 11, the P type source and drain layers 17 are formed in the surface region of the N well layer 11. After removing the resist film, the N type source and drain layer 37 and the N type source and drain layer 17 are high temperature heat treated so as to activate.

After forming the N type source and drain layers 37 and the P type source and drain layers 17, a film of a metal such as nickel (Ni) is deposited on the silicon substrate 2, and after a heat treatment, the silicide layers are formed. As a result, on the gate electrode 13 and the P type source and drain layers 17, the silicide layer 20a and the silicide layers 20b are formed. On the gate electrode 33 and the N type source and drain layers 37, the silicide layer 40a and the silicide layers 40b are formed.

After the silicide layer 20a, the silicide layers 20b, the silicide layer 40a and the silicide layers 40b are formed, the semiconductor device including the CMOSFET 1 is completed by forming interlayer insulating films, via holes and wiring layers and so on using a well-known technique.

As described above, in the semiconductor device and the method of fabricating the semiconductor device of the first embodiment, by inserting hafnium between the gate insulating film and the gate electrode, while the impurity concentrations in the channel regions are kept to low values, the threshold voltages of the P-channel MOSFET 10 and the N-channel MOSFET 30 are set to the predetermined values, respectively. In addition, the surface density of the hafnium layer 34 of the N-channel MOSFET 30 is set lower than the surface density of the hafnium layer 14 of the P-channel MOSFET 10.

Thus, the ON currents of the N-channel MOSFET 30 and the P-channel MOSFET 10 can be improved. In addition, the TDDB life time Tbd of the N-channel MOSFET 30 can be improved. Accordingly, the characteristic of the CMOSFET1 composed of the N-channel MOSFET 30 and the P-channel MOSFET 10 can be improved, and the life of the semiconductor device can be improved.

In the embodiment, by giving priority to the TDDB life time Tbd of the N-channel MOSFET 30, the surface density of the hafnium layer 34 of the N-channel MOSFET 30 is set lower than $3 \times 10^{13}$ (atoms/cm$^2$), but in case that the ON current of the N-channel MOSFET 30 is given more priority than the TDDB life time Tbd of the N-channel MOSFET 30, to set the surface density of the hafnium layer 34 of the N-channel MOSFET 30 higher than $3 \times 10^{13}$ (atoms/cm$^2$) may be possible.

Figure 12:
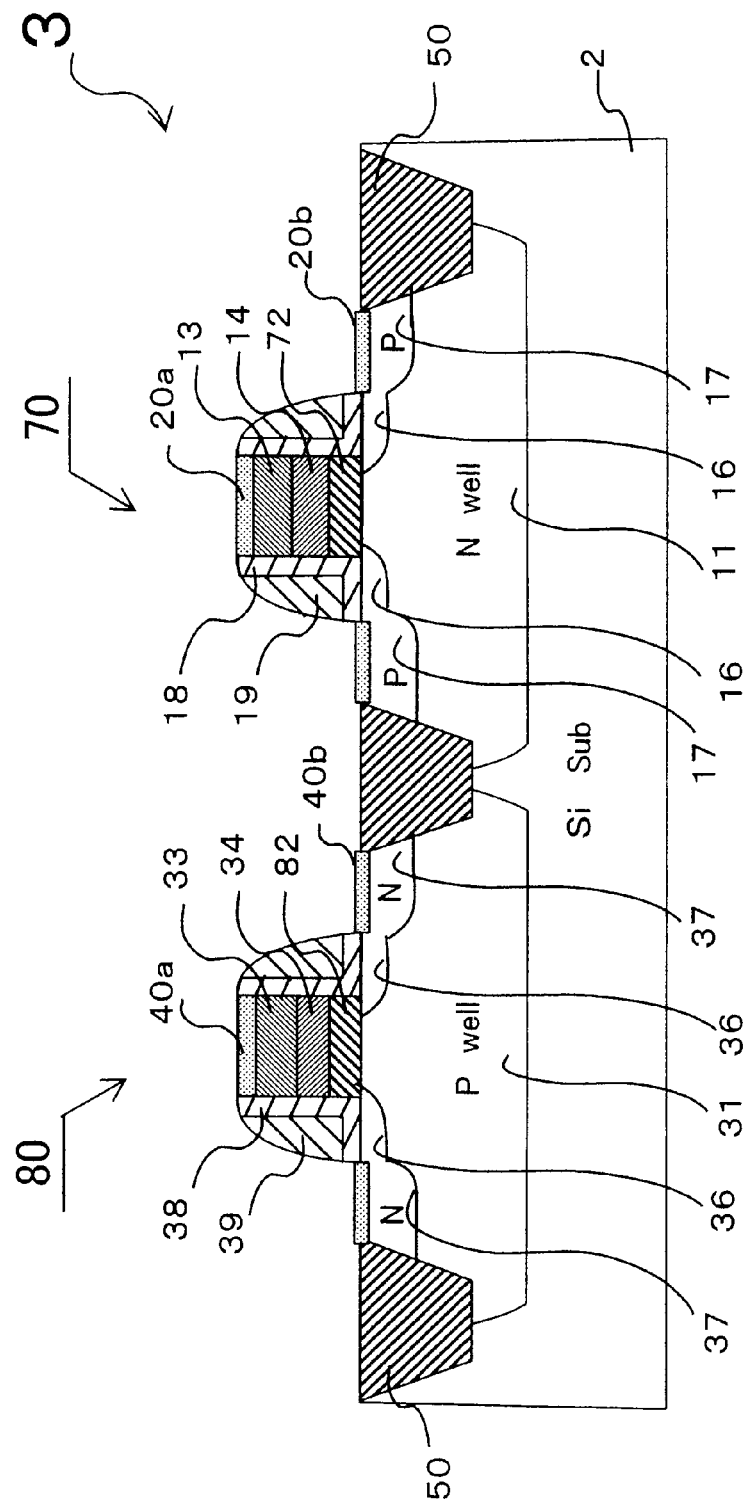
FIG. 12 is a cross-sectional view showing a semiconductor device according to a second embodiment of the invention.

A semiconductor device and a method of fabricating a semiconductor device according to a second embodiment of the invention will be described with reference to the drawings. FIG. 12 is a cross-sectional view showing a semiconductor device. In the embodiment, a surface density of a hafnium layer used in a gate of a N-channel MOSFET is set lower than a surface density of a hafnium layer introduced in a gate of a P-channel MISFET, and a silicon oxynitride film (SiON film) is used for a gate insulating film of the P-channel MISFET.

Hereinafter, the same portions as those of the first embodiment are denoted by the same reference numerals. Description of the same portions will be omitted, and description will be given only with regard to different portions.

As shown in FIG. 12, in a semiconductor device including a CMISFET 3, the N well layer 11 and the P well layer 31 are provided in a surface of the silicon substrate 2. The CMISFET 3 is composed of a P-channel MISFET (Metal Insulator Semiconductor Field Effect Transistor) 70 formed on the N well layer 11 and a N-channel MOSFET 80 formed on the P well layer 31. The P-channel MISFET 70 and the N-channel MOSFET 80 are isolated each other by the STI 50 buried in the surface region of the silicon substrate 2.

In the P-channel MISFET 70, a gate insulating film 72, the hafnium layer 14, the gate electrode 13 and the silicide layer 20a are stacked on the N-well layer 11. The gate insulating film 72 is composed of a silicon oxynitride film (SiON film). In case that the silicon oxynitride film is used for the gate insulating film, to generate a phenomenon that boron penetrates from the gate electrode to the silicon substrate side, for example, can be suppressed. The higher the concentration of nitrogen of the silicon oxynitride film is, the more the boron penetrating phenomenon can be suppressed. Thus, to use the silicon oxynitride film is particularly effective for preventing the penetration of the boron in the P-channel MOSFET having the gate insulating film made in a thinner film.

In the N-channel MOSFET 80, a gate insulating film 82, the hafnium layer 34, the gate electrode 33, and the silicide layer 40a are stacked on the P well layer 31. The gate insulating film 82 is composed of silicon oxide film (SiO$_2$ film).

Figure 13:
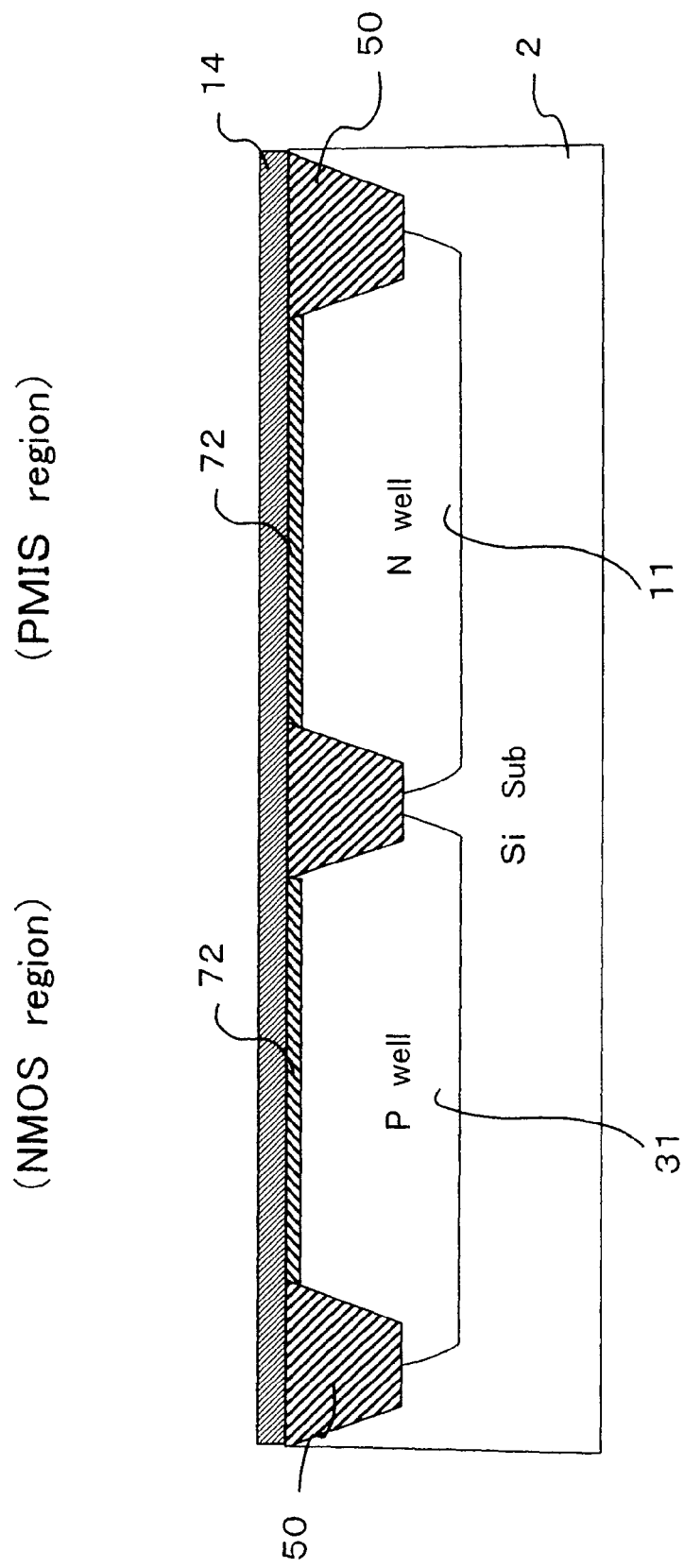
FIG. 13 to FIG. 15 are cross-sectional views for illustrating a fabrication process for the semiconductor device according to the second embodiment of the invention.
Figure 14:
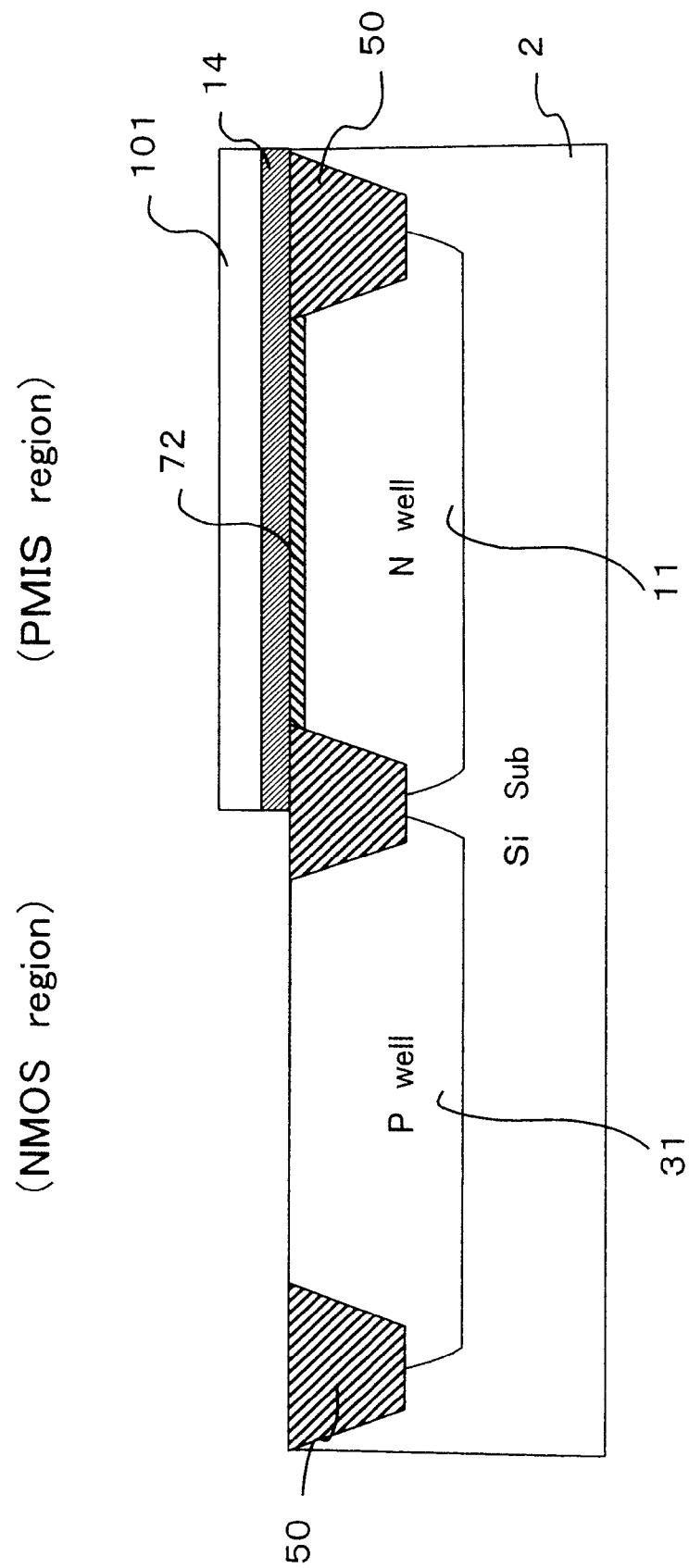
Figure 15:
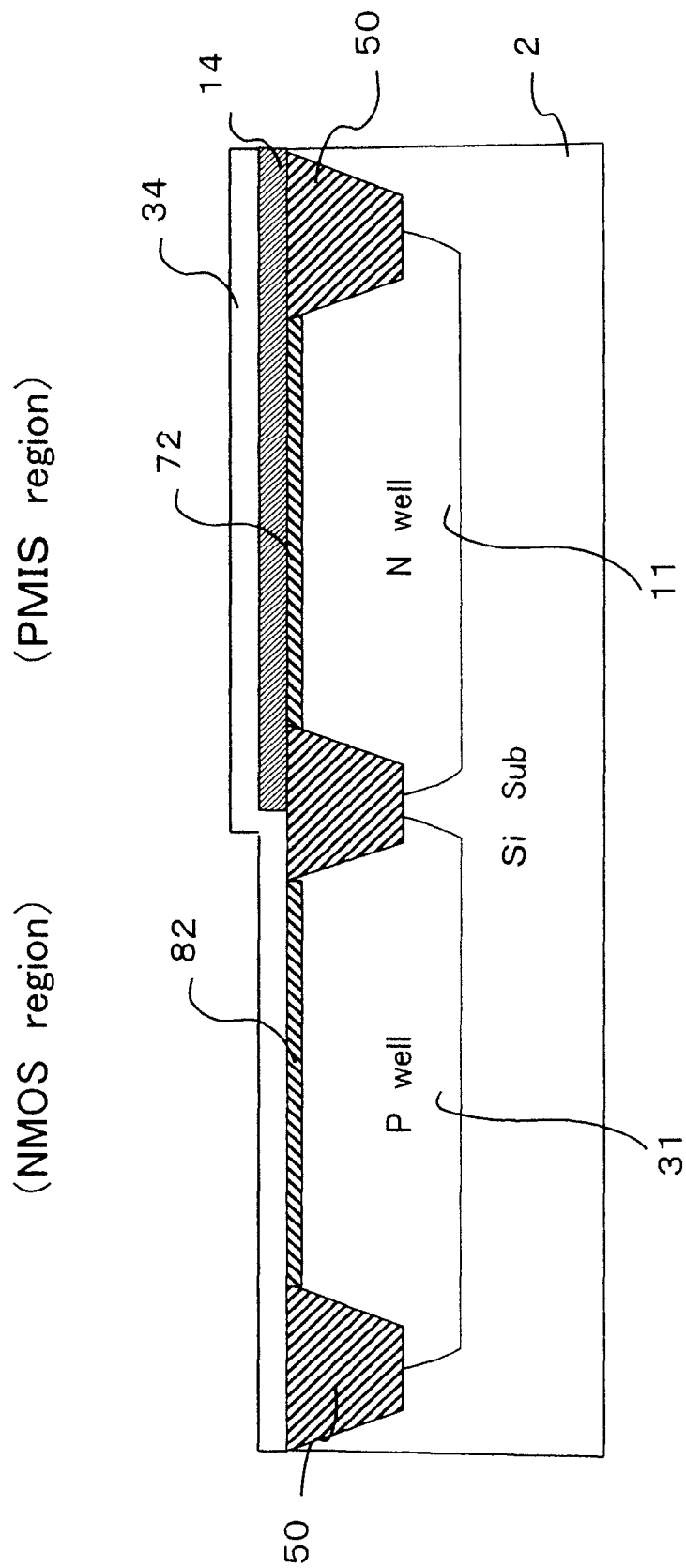

Next, a method of fabricating the semiconductor device including the CMISFET 3 will be described with reference to the drawings. FIG. 13 to FIG. 15 are cross-sectional views for illustrating a fabrication process for the semiconductor device.

As shown in FIG. 13, firstly, the STI 50 is formed in a surface region of the silicon substrate 2 so as to isolate a region to form the P-channel MISFET 70 (hereinafter, called simply as a PMIS region) from a region to form the N-channel MOSFET 80 (hereinafter, called simply as an NMOS region). After forming the N well layer 11 and the P well layer 31 in the same manner as in the first embodiment, a gate insulating film 72 composed of the silicon oxynitide film (SiON film) is formed on the surface of the silicon substrate 2, for example.

In order to form the gate insulating film 72 composed of the silicon oxynitride film (SiON film), a plurality of methods are used. A method of forming a silicon oxynitride film (SiON film) used here is to form a silicon oxide film (SiO$_2$ film) on the surface of the silicon substrate 2, for example. By nitriding a surface side of the silicon oxide film (SiO$_2$ film) using plasma with lower damage, for example, a silicon oxynitride film (SiON film) is formed.

Or, in place of a plasma nitriding method, a closed-grained silicon nitride film (SiN film) without excessive nitrogen is deposited on the surface of the silicon substrate 2. A method may be used in which the surface of the silicon substrate 2 formed the silicon nitride film (SiN film) is oxidized by a high temperature heat treatment in the presence of oxygen to form a silicon oxynitride film (SiON film). In the method, if the gate insulating film 72 is made in a thinner film, a silicon oxynitride film (SiON film) with excellent film property can be obtained.

After forming the gate insulting film 72, hafnium is deposited on the gate insulating film 72 and the STIs 50 using a sputter deposition method, for example.

Next, as shown in FIG. 14, the mask material 101 is formed on the hafnium layer 14. A resist film is formed on the mask material 101 at the PMIS region using a well-known lithography method. The mask material 101 is etched using the resist film as a mask. After removing the resist film, the hafnium layer 14 and the gate insulating film 72 at the NMOS region are etched using the mask material 101 as a mask and using dilute hydrofluoric acid. The mask material 101 is removed. As a result, the gate insulating film 72 and the hafnium layer 14 are stacked on the N well layer 11 at the PMIS region. The surface of the P well layer 31 at the NMOS region is exposed.

Subsequently, as shown in FIG. 15, by oxidizing the surface of the silicon substrate 2 at a high temperature heat treatment in the presence of oxygen, for example, the gate insulating film 82 composed of a silicon oxide film ($SiO_2$ film) is formed on the P well layer 31. Here, the gate insulating film 82 is made of the silicon oxide film ($SiO_2$ film), but instead of the silicon oxide film ($SiO_2$ film), a silicon oxynitride film (SiON film) with a lower nitrogen concentration than that of the silicon oxynitride film (SiON film) at the PMIS region may be used. In case that the silicon oxynitride film (SiON film) is used, a leak current of the N-channel MISFET can be made lower than a leak current flowing between the gate electrode 33 of the N-channel MOSFET 80 and a channel region (P well layer 31), for example.

After forming the gate insulating film 82, hafnium (Hf) is deposited on the gate insulating film 82 and hafnium layer 14 using a sputter deposition method, for example. The hafnium layer 34 is formed on the gate insulating film 82. At the PMIS region, the surface density of the hafnium 14 increases as the hafnium is deposited at the upper portion. By this, the surface density of the hafnium layer 14 becomes higher than the surface density of the hafnium layer 34. In this time, the surface density of the hafnium layer 34 is set lower than $3 \times 10^{13}$ (atoms/cm$^2$). In addition, as the following processes are the same as in the first embodiment, the description is omitted.

As described above, in the semiconductor device and the method of fabricating the semiconductor device of the second embodiment, by inserting hafnium between the gate insulating film and the gate electrode, while the impurity concentrations in the channel regions are kept to low values, the threshold voltages of the P-channel MISFET 70 and the N-channel MOSFET 80 are set to the predetermined values, respectively. In addition, the surface density of the hafnium layer 34 of the N-channel MOSFET 80 is set lower than the surface density of the hafnium layer 14 of the P-channel MISFET 70. In addition, the silicon oxynitride film (SiON film) is used as the gate insulating film 72 of the P-channel MOSFET 70. The silicon oxide film ($SiO_2$ film) is used as the gate insulating film 82 of the N-channel MOSFET 80.

Accordingly, beside the effect of the first embodiment, a penetration of boron which generates in the P-channel MISFET 70 can be suppressed, and the deterioration of the electrical property of the P-channel MISFET 70 can be suppressed. In addition, the deterioration of the interface property between the gate insulating film 82 of the N-channel MOSFET 80 and the silicon substrate 2 can be suppressed, and the deterioration in mobility of the carriers at the channel region of the N-channel MOSFET 80 can be suppressed. Therefore, the characteristic of the CMISFET 3 composed of the N-channel MOSFET 80 and the P-channel MISFET 70 can be improved and the life of the semiconductor device can be improved.

The invention is not limited to the above-described embodiments, and various changes may be made in the invention without departing from the spirit and scope of the invention.

For example, in the embodiments, the hafnium layer is provided between the gate insulating film and the gate electrode, but instead of hafnium, zirconium (Zr), lanthanum (La), praseodymium (Pr), aluminum (Al) or yttrium (Y) may be used.

What is claimed is:

1. A method of fabricating a semiconductor device, comprising:
    forming an N well layer and a P well layer in a surface region of a semiconductor substrate;
    forming a first gate insulating film on the N well layer and the P well layer;
    forming a first hafnium layer on the first gate insulating layer;
    etching the first gate insulating film and the first hafnium layer formed on the P well layer selectively;
    forming a second gate insulating film on the exposed P well layer;
    depositing a hafnium layer on the second gate insulating film and the first hafnium layer to form a second hafnium layer on the second gate insulating film so that a surface density of the first hafnium layer is higher than a surface density of the second hafnium layer;
    depositing a gate electrode material on the first and the second hafnium layers; and
    etching the gate electrode material, the first hafnium layer and the first gate insulating film which are formed on the N well layer so as to pattern the first gate insulating film, the first hafnium layer and a first gate electrode which are stacked on the N well layer, and etching the gate electrode material, the second hafnium layer and the second gate insulating film which are stacked on the P well layer so as to pattern the second gate insulating film, the second hafnium layer and a second gate electrode which are stacked on the P well layer.

2. The method according to claim 1, wherein the first and the second gate insulating films are silicon oxide films, further comprising:
    nitriding the first gate insulating film so as to form a first silicon oxynitride film after forming the first gate insulating film.

3. The method according to claim 2, further comprising:
    nitriding the second gate insulating film so as to form a second silicon oxynitride film with a lower nitrogen concentration than that of the first silicon oxynitride film after forming the second gate insulating film.

4. The method according to claim 1, wherein the first and the second hafnium layers are formed using a sputter deposition method, an ALD method or an MOCVD method.

5. The method according to claim 1, wherein the gate electrode material is formed using a CVD method, and wherein the gate electrode material is a polycrystalline silicon film or an amorphous silicon film doped with an impurity in a high concentration.

6. The method according to claim 1, wherein a surface density of the second hafnium layer is lower than a surface density of the first hafnium layer.

7. The method according to claim 1, wherein a surface density of the second hafnium layer is lower than $3\times10^{13}$ (atoms/cm$^2$).

\* \* \* \* \*